United States Patent [19]
Sudoh et al.

[11] Patent Number: 5,357,595
[45] Date of Patent: Oct. 18, 1994

[54] SOUND RECORDING AND REPRODUCING APPARATUS FOR DETECTING AND COMPENSATING FOR RECORDED PERIODS OF SILENCE DURING REPLAY

[75] Inventors: Kengo Sudoh, Higashihiroshima; Yuji Sumitomo, Yamatokoriyama, both of Japan

[73] Assignee: Sharp Kabushiki Kaisha, Osaka, Japan

[21] Appl. No.: 903,281

[22] Filed: Jun. 24, 1992

[30] Foreign Application Priority Data

Jul. 8, 1991 [JP] Japan .................................. 3-166980

[51] Int. Cl.⁵ .............................................. G10L 9/00
[52] U.S. Cl. .................................. 395/2.24; 395/2.22; 395/2.79
[58] Field of Search ................................ 381/29–35, 381/41–53; 395/2.24, 2.22, 2.79; 379/75, 88, 89; 369/67, 65, 25, 50; 365/230.08, 238.5, 45; 434/185; 84/603, 604, 630, 633; 368/63

[56] References Cited

U.S. PATENT DOCUMENTS

| | | | |
|---|---|---|---|
| 4,717,261 | 1/1988 | Kita et al. .............................. | 381/51 |
| 4,813,014 | 3/1989 | DeBell ................................... | 365/45 |
| 4,856,066 | 8/1989 | Lemelson ............................. | 395/2 |
| 4,916,742 | 4/1990 | Kolesnikov et al. ................. | 381/30 |
| 4,944,012 | 7/1990 | Morio et al. .......................... | 381/30 |
| 4,947,723 | 8/1990 | Kawashima et al. ................. | 381/51 |
| 5,056,145 | 10/1991 | Yamamoto et al. .................. | 395/2 |

FOREIGN PATENT DOCUMENTS

0288206A2 10/1988 European Pat. Off. ........ G06F 3/16

Primary Examiner—Gopal C. Ray
Assistant Examiner—Michelle Doerrler
Attorney, Agent, or Firm—Nixon & Vanderhye

[57] ABSTRACT

A sound recording and reproducing apparatus includes a semiconductor memory, an acoustic signal writing unit for writing a digital acoustic signal to the semiconductor memory, and a read out unit for reading out digital acoustic signals addressed in the semiconductor memory during sound reproduction (replay). An address memory stores these addresses as the acoustic signals are read out. A silence detector detects recorded silent or nearly silent portions during sound reproduction. The address(es) of these silent portions is (are) sequentially stored. In response to a recall or replay instruction, a controller reads out from the semiconductor memory digital acoustic signals at memory addresses that follow those sequentially stored in the address memory. As a result, recorded sound information (as opposed to recorded silence) may be quickly accessed and replayed upon recall at the beginning of recorded acoustic signals. A user therefore need not listen unnecessarily to recorded periods of silence of the acoustic signals being recalled.

15 Claims, 3 Drawing Sheets

SOUND RECORDING AND REPRODUCING APPARATUS FOR DETECTING AND COMPENSATING FOR RECORDED PERIODS OF SILENCE DURING REPLAY

FIELD OF THE INVENTION

The present invention relates to a sound recording and reproducing apparatus in which an analog acoustic signal generated by a microphone or the like is converted into a digital signal to be stored in a semiconductor memory device, and the digital signal stored in the semiconductor memory device is reformed into an analog acoustic signal so that a sound is reproduced by a speaker or the like.

DESCRIPTION OF THE RELATED ART

There has been known a sound recording and reproducing apparatus, a so-called cassette tape recorder, which uses a magnetic tape such as a cassette tape. Referring to such an apparatus using the magnetic tape, the price of the tape is low, and recording and reproduction can be performed for many hours. But such an apparatus necessarily includes the mechanism for running the tape, for that cause, it is difficult to make the apparatus small-sized and light, a noise is unavoidable, a failure rate in reproduction is high and time is required for re-finding the sound which went past, wherein quick feed and rewind are involved manually.

To eliminate the above-mentioned drawbacks, there has been developed a sound recording and reproducing apparatus using a semiconductor memory in place of the magnetic tape. Referring to the semiconductor memory, an access speed is in the order of microsecond, and the head of a desired part of a recorded sound can instantaneously be accessed and started. In addition, the mechanism necessary to the tape system is dispensable so that the apparatus can be small-sized and light. Further, the noise is not made. In particular, a removable memory card is convenient.

Referring to the semiconductor memory, the price is generally high and power backup is needed. Recently, there has been manufactured a nonvolatile batch erasable memory of which price is relatively low and which does not need battery backup. These recent progresses will solve the above-mentioned problems.

In the case where the sound recording and reproducing apparatus is particularly used for language learning or message dictation, important is execution of a recall request that a user wants to retroactively hear a reproduced phrase which he or she failed to catch. Referring to the execution by a conventional apparatus using a tape, it is the practice to retroactively hear the phrase by running, first, the tape in the reverse direction and then reproducing the sound series, and carrying out the stop and play operations for catching a break in the continual sound (or by means of a silent part detecting circuit). Continuous recording and replaying of the tape is involved consuming considerable amounts of time. In addition, it is very difficult to precisely stop the tape at a desired position because the stop and play operations are mechanically carried out.

In the sound recording and reproducing apparatus using the semiconductor memory described above, the access speed to the memory is in the order of microsecond, and a normal re-starting is carried out instantaneously with the head of a desired part of the sound series and the like. However, when it comes to a recall request on the way of reproduction, it is necessary to perform complicated digital signal processings comprised of tracing memory addresses to search the data of a memory for a silent or unreproduced part and of re-starting sound reproduction at that point. Consequently, the structure of required circuits is large-scaled. In the case where the sound signal is subjected to the data compression and recorded, particularly, the digital signal processings are more complicated.

When a recall key is pressed down by a user to reproduce a short phrase which the user failed to hear, the reproduction has often advanced to the next phrase or some part gone past, because of time lag in the pressing act, that is, the stopped point is often a location which one or more silent parts (portion between phrases or sound series) are passed over. In such a case, if only the re-starting with the head of the present phrase is carried out by means of the above-mentioned apparatus, it is impossible to come back to hear a desired phrase gone past.

As the related art to the present invention, there has been known a recording control circuit of a sound recording and reproducing apparatus disclosed in Japanese Unexamined Patent Publication No. 259700/1988, wherein a recording end position in which a memory is used is written as index data to a semiconductor memory circuit at the time of a recording operation, and the recording operation is started in the recording end position when recording manipulation is carried out without other operations after the attachment of the semiconductor memory circuit to a body or after Dower supply.

SUMMARY OF THE INVENTION

The present invention provides a sound recording and reproducing apparatus comprising a semiconductor memory device for storing a digital signal, acoustic signal writing means for converting an inputted acoustic signal into a digital signal and writing the digital signal to the semiconductor memory device, reading out means for reading out the digital signal from the semiconductor memory device, converting the digital signal into an acoustic signal and outputting the acoustic signal as a sound at the time of sound reproduction, address storing means for storing an address read out from the semiconductor memory device, silent part detecting means for always monitoring a silent part of a reproduced sound and outputting a silent part detecting signal every time the silent part is detected during sound reproduction, address writing means for writing to the address storing means an address read out from the semiconductor memory device when the silent part is detected in response to the silent part detecting signal, input means for inputting a recall instruction, and control means for reading out from the semiconductor memory device digital signals on addresses subsequent to those stored in the address storing means, converting the digital signals into acoustic signals and outputting the acoustic signals as sounds in response to the recall instruction inputted from the input means, wherein the address storing means stores, as first and second silent part addresses, addresses read out from the semiconductor memory device when a silent part is detected and when a previous silent part is detected, and the control means compares the address read out from the semiconductor memory device when a recall instruction is inputted from the input means with the first silent part address stored in the address storing means, selects one of the first and second silent part addresses based on the result of comparison, reads out digital signals on addresses subsequent to the selected address from the semiconductor memory device, converts the digital signals into acoustic signals, and outputs the acoustic signals as sounds in response to the recall instruction inputted from the input means.

It is to be noted here that the silent part in the present invention indicates an address portion which gives no sound with acoustic level, and that it results in a time location in which any sound with listenable level is unreproduced.

According to the present invention, the address of the silent part is stored in the address register. Consequently, when a recall is requested (for example, a recall key is pressed down), a response can immediately be performed. In addition, the structure of a circuit can relatively be simplified.

Even if a new phrase is started at the time of reproduction, a previous phrase is reproduced when pressing down the recall key within a given time. Consequently, even if the recall key is pressed down slightly late when reproducing a short phrase, the user can hear a desired phrase without errors. If a further register is provided, the user can hear earlier phrases.

DESCRIPTION OF THE PREFERRED EMBODIMENTS

Figure 1:
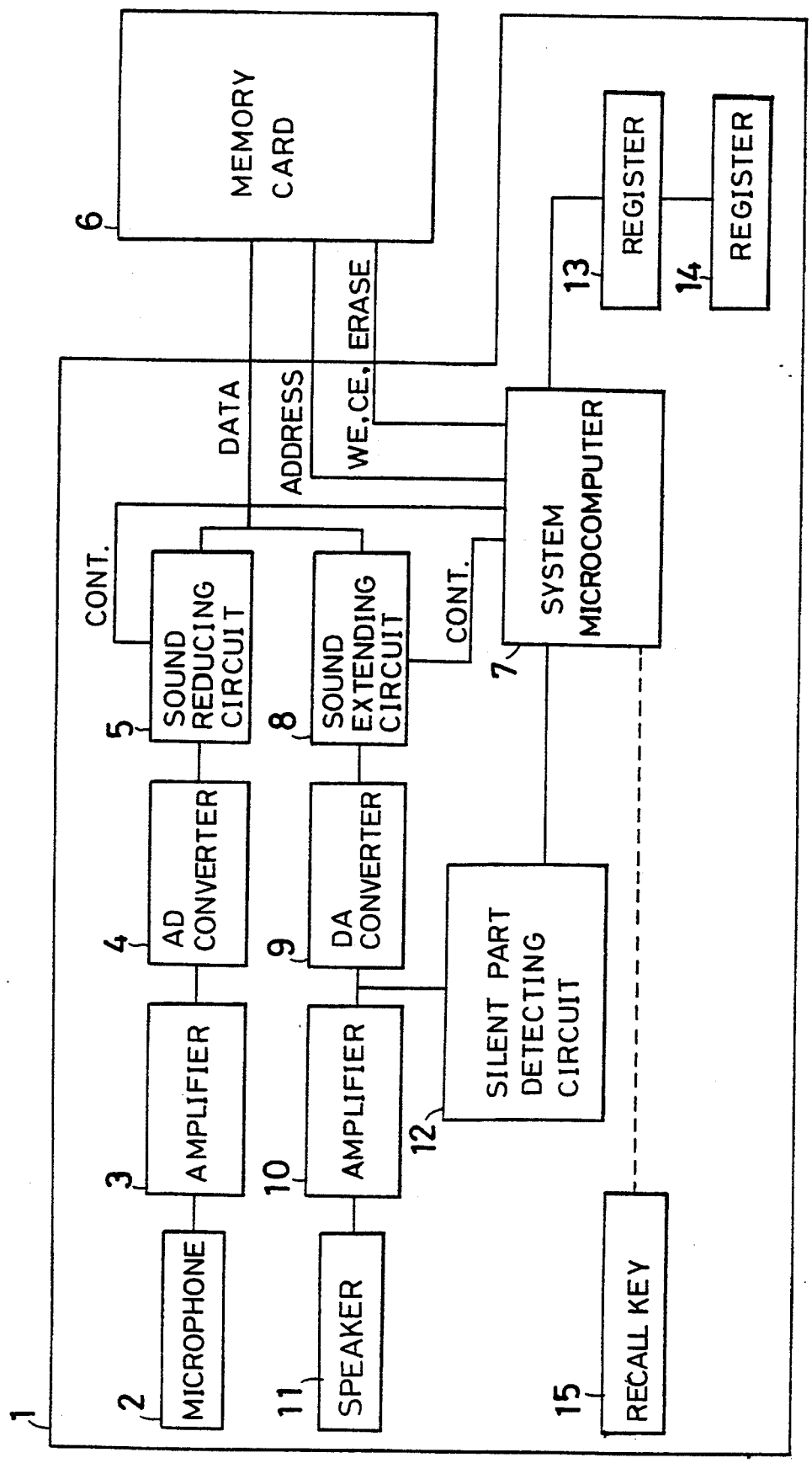
FIG. 1 is a block circuit diagram of a sound recording and reproducing apparatus according to an embodiment of the present invention.
Figure 2:
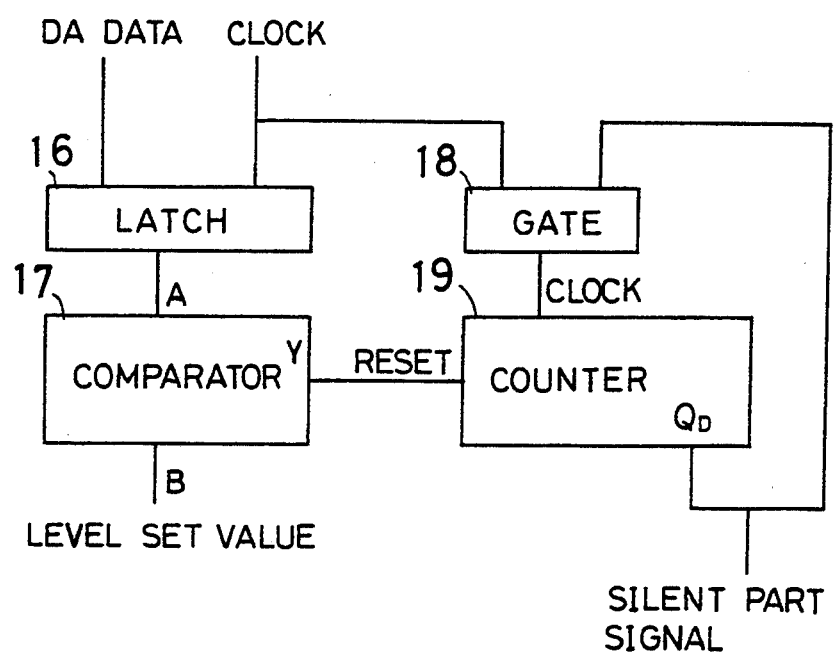
FIG. 2 is a block diagram of a silent part detecting circuit of the sound recording and reproducing apparatus.

An embodiment of the present invention will be described with reference to the drawings. FIG. 1 is a block diagram of a sound recording and reproducing apparatus according to an embodiment of the present invention. FIG. 2 is a block diagram of a silent part detecting circuit of the sound recording and reproducing apparatus. As shown in FIG. 1, the sound recording and reproducing apparatus comprises a body 1 and a memory card (semiconductor memory device) 6 as a removable recording medium for storing the sound data therein. The body 1 includes a recording circuit part, a reproducing circuit part, a silent part detecting circuit (silent part detecting means), storing means and the like.

The recording circuit part has a microphone 2, an amplifier 3, an AD converter 4, a sound reducing circuit 5, a system microcomputer 7 and the like. A sound is converted into an analog electric signal (analog acoustic signal) by the microphone 2. The analog electric signal is amplified by the amplifier 3 and then converted into a digital signal by the AD converter 4. The digital signal is reduced or compressed by a factor of several or up to several tens through the sound reducing circuit 5. The reduced data is once fetched to the system microcomputer 7. Then, the reduced data is written to the memory card 6 by addressing through the system microcomputer 7. The system microcomputer 7 repeatedly performs the operation of sequentially fetching the reduced data from the sound reducing circuit 5 while incrementing addresses, and writing the same to the memory card 6. Thus, sound recording is carried out.

The reproducing circuit part has the system microcomputer 7, a sound extending circuit 8, a DA converter 9, an amplifier 10, a speaker 11 and the like. The reduced data recorded in the memory card 6 are repeatedly read out while the addresses are sequentially incremented by the system microcomputer 7. The reduced data thus read out is sent to the sound extending circuit 8 and then converted into an original digital acoustic signal by the sound extending circuit 8. The digital acoustic signal is converted into an analog acoustic signal by the DA converter 9. Then, the analog acoustic signal is amplified by the amplifier 10, and reproduced and outputted as a sound by the speaker 11. Thus, a sound is reproduced.

As shown in FIG. 2, a silent part detecting circuit 12 includes a latch 16, a comparator 17, a gate circuit 18, a counter 19 and the like. The digital acoustic signal outputted from the sound extending circuit 8 is inputted to the silent part detecting circuit 12. The inputted digital acoustic signal (hereinafter referred to as DA data) is once latched in the latch 16. The comparator 17 compares a latched value with a predetermined level set value (it is decided whether there is no sound depending on the predetermined level set value). As the result of comparison, when the DA data has a greater value than the level set value, a signal for resetting the counter 19 is outputted. When the DA data has a smaller value than the level set value, the counter 19 is released from a reset state and counts up by a clock which passes through the gate circuit 18. By way of example, an output $Q_D$ of the counter 19 is connected to the gate circuit 18. When the counter 19 counts up to 8, the value of the output $Q_D$ is changed from "0" to "1" Consequently, the gate circuit 18 is closed and a silent part signal is outputted to the system microcomputer 7. The gate circuit 18 is kept closed until DA data having a greater value than the level set value is inputted. Thus, the silent part detecting circuit 12 decides that there is no sound if eight or more DA data having a lower level than a preset level are continuously inputted, and outputs a silent part detecting signal.

The storing means has registers 13 and 14. When inputting the silent part detecting signal from the silent part detecting circuit 12, the system microcomputer 7 writes a memory read-out address to the register 13 at this point. The write clocks of the registers 13 and 14 are connected in parallel with each other. Consequently, when new addresses are written to the register 13, all the address values stored in the register 13 up to this point are shifted to the register 14.

In FIG. 1, the reference numeral 15 denotes a recall key for giving recall instructions.

Figure 3:
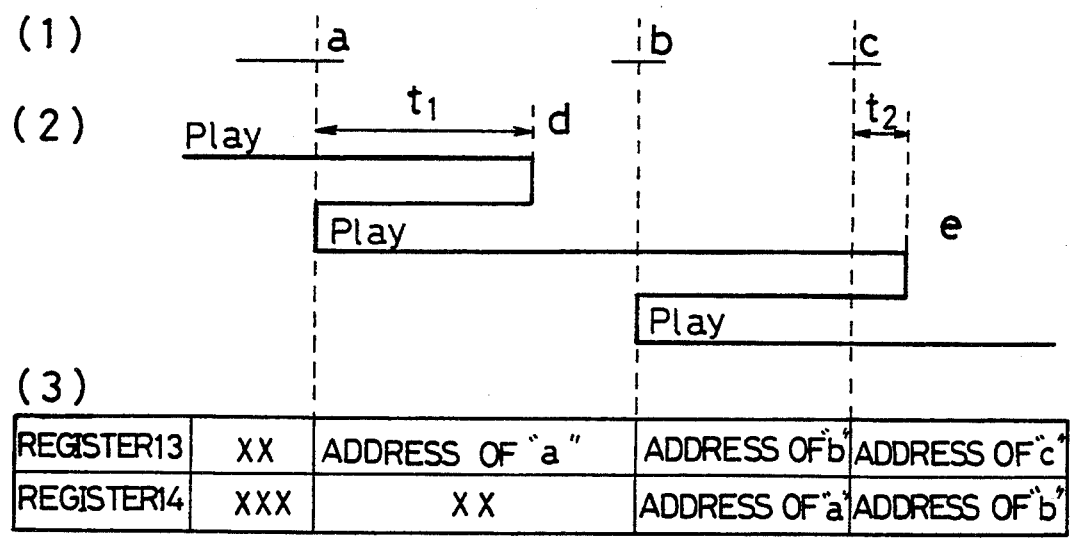
FIG. 3 is a diagram for explaining the recall operation of the sound recording and reproducing apparatus.

With reference to FIG. 3, there will be described the phrase recall operation which is the important point of the present invention. The reference numeral (1) typically denotes a sound recorded in the memory. Points a, b and c denote silent parts. The reference numeral (2) denotes a state of reproduction. The reference numeral (3) denotes the contents of the registers 13 and 14 at respective points corresponding to (1) and (2). First, the silent part is detected at the point a so that the address of the point a is stored in the register 13. Then, the silent part is detected at the point b so that the address of the point b is stored in the register 13. The address of the point a which is the original data of the register 13 is shifted to the register 14. Similarly, when passing through the point c, the addresses of the points c and b are stored in the registers 13 and 14 respectively.

There will be described the state of the recall operation (2). It is supposed that the recall key 15 is pressed down at a point d while reproduction is carried out. At this time, the system microcomputer 7 calculates the difference between the address of the point d and the address stored in the register 13 (i.e., a period of time t1). Since the period of time t1 is greater than a preset value, reproduction is resumed by returning to the address of the point a stored in the register 13. The time required for pressing down the recall key 15 and resuming reproduction is in the order of millisecond, which is instantaneous to person's perception.

It is assumed that the recall key 15 is pressed down at a point e. Also at this time, the system microcomputer 7 calculates the difference between the address of the point e and the address stored in the register 13 (i.e., a period of time t2). Since the period of time t2 is smaller than a preset value, reproduction is resumed by returning to the address of the point b stored in the register 14. More specifically, a recall at the point e is generally indicative of a request that a user wants to hear phrases at and after the point b, to which the present embodiment corresponds.

While two registers are provided as storing means in the above-mentioned embodiment, only one, or three or more register(s) may be provided. In the case where only one register is provided, the user can hear a desired phrase from the beginning during reproduction irrespective of the timing of a recall instruction. In the case where three or more registers are provided, the user can reproduce and hear a desired phrase if means for specifying a phrase to be reproduced is added.

The present invention should not be construed as being limited by the embodiment described above and shown in the drawings, and various changes and modifications can be made without departing from the scope of the present invention.

According to the present invention, there can be realized a recall function which makes the most of instantaneous accessibility as the characteristic of the semiconductor memory device, is suitable for the actual circumstances and has good operability with a relatively simple circuit structure.

What is claimed is:

1. A sound recording and reproducing apparatus comprising:
    a semiconductor memory device for storing a digital signal;
    acoustic signal writing means for converting an inputted acoustic signal into a digital signal and writing the digital signal into said semiconductor memory device;
    reading out means for addressing and reading out the digital signal from said semiconductor memory device, converting the digital signal into an acoustic signal and outputting the acoustic signal as a sound at the time of sound reproduction;
    address storing means for storing an address used in reading the digital signals out from said semiconductor memory device;
    silent part detecting means for monitoring a silent part of a reproduced sound and outputting a silent part detecting signal every time the silent part is detected during sound reproduction;
    address writing means for writing to said address storing means an address corresponding to the silent part detected by the silent part detecting signal;
    input means for inputting a recall instruction; and
    control means for reading out from said semiconductor memory device digital signals at addresses subsequent to those stored in said address storing means corresponding to the silent part of a reproduced sound, converting the digital signals into acoustic signals and outputting the acoustic signals as sound in response to the recall instruction inputted from said input means.

2. A sound recording and reproducing apparatus according to claim 1, wherein said address storing means stores, as first and second silent part addresses, addresses read out from said semiconductor memory device when a silent part is detected and when a previous silent part is detected, and
    said control means compares the address read out from said semiconductor memory device when a recall instruction is inputted from said input means with the first silent part address stored in said address storing means, selects one of the first and second silent part addresses based on the result of comparison, reads out digital signals on addresses subsequent to the selected address from said semiconductor memory device, converts the digital signals into acoustic signals, and outputs the acoustic signals as sounds in response to the recall instruction inputted from said input means.

3. A sound recording and reproducing apparatus according to claim 1, wherein said silent part detecting means includes a comparator for comparing a predetermined level with the level of the digital signal read out from said semiconductor memory device by said reading out means, and a counter for counting a given period when the level of the digital signal is lower than the predetermined level, and deciding that there is no sound and outputting a silent part detecting signal when the level of the digital signal is low by the given period or more as the result of comparison.

4. A sound recording and reproducing apparatus according to claim 1, wherein said semiconductor memory device is a memory card which can be attached to and removed from a body of said sound recording and reproducing apparatus.

5. An audio signal recording and reproduction apparatus, comprising:
    an analog to digital converter for converting analog audio signals to be recorded into digital audio signals;
    a semiconductor memory for storing the digital audio signals;
    means for addressing the semiconductor memory to store digital audio signal during recording and read out digital audio signals during reproduction;
    a digital to analog converter for converting read out digital audio signals into analog audio signals;
    a detector for detecting a period of silence or near silence as digital audio signals are being read out;
    means for storing a memory address corresponding to the detected silence; and
    a controller, in response to a recall instruction for reproducing a selected portion of recorded audio signals, for reading out digital audio signals stored at addresses following the stored memory address corresponding to the detected silence.

6. An apparatus according to claim 5, wherein the detector includes:

a clock;

a counter for counting clock signals from the clock; and a comparator for comparing an amplitude of a read out signal with a predetermined signal level and resetting the counter when the read out signal amplitude is less than the predetermined signal level to indicate a detected period of silence.

7. The apparatus according to claim 5, wherein the means for storing a memory address includes means for storing plural addresses corresponding to plural periods of silence.

8. An apparatus according to claim 7, wherein the controller includes:

means for determining the duration of detected periods of silence, and means for restarting reproduction of recorded audio signals at the most recently stored address if the silence duration equals or exceeds a preset duration and restarting reproduction of recorded audio signals at a stored address other than that most recently stored if the silence duration is less than the preset duration.

9. An apparatus for digitally recording and reproducing acoustic information signals, comprising:

a semiconductor memory;

means for recording acoustic signals in the memory;

means for reproducing the recorded acoustic signals by addressing the memory;

means for detecting an absence of an acoustic information signal;

means for storing an address corresponding to the detected absence;

means for receiving a replay instruction for replaying a portion of recorded acoustic signals; and means, in response to the replay instruction, for reproducing the portion of recorded acoustic information signals restarting at the stored address corresponding to the detected absence.

10. The apparatus according to claim 9, wherein the means for detecting includes:

a clock;

a counter for counting clock signals received from the clocks; and a comparator for comparing the reproduced recorded acoustic signals with a predetermined signal such that if the reproduced recorded acoustic signal is less than the predetermined signal, the counter is reset to indicate a detected period of silence.

11. The apparatus according to claim 9, wherein the means for storing an address includes plural addresses corresponding to plural periods of silence.

12. An apparatus according to claim 11, wherein the controller includes:

means for determining the duration of the periods of silence, and means for restarting reproduction of audio signals at the most recently stored address if the silence duration equals or exceeds a preset duration and restarting reproduction of audio signals at a stored address other than that most recently stored if the determined duration of silence is less than the preset silence period.

13. A method of digitally recording and reproducing acoustic signals, comprising:

(a) recording acoustic signals in a semiconductor memory;

(b) addressing the memory and reproducing the stored acoustic signals;

(c) detecting silence or near silence in the recorded acoustic signals;

(d) storing an address corresponding to the detected silence or near silence;

(e) receiving a recall instruction for reproducing a portion of the recorded acoustic signals; and (f) responding to the recall instruction by reproducing the portion of the recorded acoustic signals starting from the stored address corresponding to the detected silence or near silence.

14. The method according to claim 13 wherein step (d) further includes storing plural addresses corresponding to plural detected periods of silence.

15. The method according to claim 13 wherein the detecting step (c) further comprises comparing the duration of the detected silence or near silence to a preset time period.

* * * * *